US008269140B2

(12) United States Patent
Matsushita

(10) Patent No.: US 8,269,140 B2
(45) Date of Patent: Sep. 18, 2012

(54) METHOD AND APPARATUS FOR LASER SOLDERING

(75) Inventor: Kotaro Matsushita, Tokyo (JP)

(73) Assignee: Japan Unix Co., Ltd., Tokyo (JP)

( * ) Notice: Subject to any disclaimer, the term of this patent is extended or adjusted under 35 U.S.C. 154(b) by 505 days.

(21) Appl. No.: 12/484,535

(22) Filed: Jun. 15, 2009

(65) Prior Publication Data

US 2009/0321394 A1    Dec. 31, 2009

(30) Foreign Application Priority Data

Jun. 30, 2008   (JP) ................................. 2008-170935

(51) Int. Cl.
*B23K 26/20*   (2006.01)
(52) U.S. Cl. ............ 219/121.85; 219/121.6; 219/121.64
(58) Field of Classification Search ............... 219/121.6, 219/121.63, 121.64, 121.85, 85.12, 85.13; 228/41, 44.7, 49.5, 244, 245, 246, 248.1, 228/248.5, 179.1, 180.1
See application file for complete search history.

(56) References Cited

U.S. PATENT DOCUMENTS

| | | | | |
|---|---|---|---|---|
| 4,588,468 A | * | 5/1986 | McGinty et al. | 228/180.1 |
| 4,899,924 A | * | 2/1990 | Kawaguchi | 219/121.63 |
| 5,122,635 A | * | 6/1992 | Knodler et al. | 219/121.63 |
| 6,160,239 A | * | 12/2000 | Cubero Pitel | 219/121.64 |
| 6,168,070 B1 | * | 1/2001 | Sinkunas | 228/179.1 |
| 6,371,017 B1 | * | 4/2002 | Yamazaki et al. | 101/129 |
| 2001/0054637 A1 | | 12/2001 | Hayakawa | |
| 2005/0133486 A1 | | 6/2005 | Baker et al. | |
| 2006/0124702 A1 | * | 6/2006 | Oonishi | 228/179.1 |
| 2006/0180245 A1 | * | 8/2006 | Wicker et al. | 228/248.1 |

FOREIGN PATENT DOCUMENTS

| | | | |
|---|---|---|---|
| DE | 4234342 A1 | * | 4/1994 |
| JP | 60-50881 A | * | 3/1985 |
| JP | 4-52073 | | 2/1992 |
| JP | 05-013950 | | 1/1993 |
| JP | 06-132649 | | 5/1994 |
| JP | 09-162536 | | 6/1997 |
| JP | 2002-1521 | | 1/2002 |
| JP | 2004-119736 | | 4/2004 |

OTHER PUBLICATIONS

Chinese Office Action issued Aug. 23, 2011, in Patent Application No. 200910148463.1 (with English-language translation).
Office Action issued May 8, 2012 in Japanese Patent Application No. 2008-170935 filed Jun. 30, 2008 (with English Translation).

* cited by examiner

*Primary Examiner* — Geoffrey S Evans
(74) *Attorney, Agent, or Firm* — Oblon, Spivak, McClelland, Maier & Neustadt, L.L.P.

(57) ABSTRACT

In accordance with an aspect of the invention, a solder paste feeding device feeds solder paste to a ring-like terminal surrounding a through-hole and a rod terminal fitted in the through-hole so as to fill in the through-hole, the laser beam irradiation device irradiates the solder past with a laser beam, and wire solder is further fed from above the solder past at the same time as melting of the solder paste is started, thereby fusing the wire solder and the solder paste to solder the ring-like terminal and the rod terminal.

8 Claims, 4 Drawing Sheets

METHOD AND APPARATUS FOR LASER SOLDERING

BACKGROUND OF THE INVENTION

1. Field of the Invention

The present invention relates to a technique of soldering electronic components such as IC and LSI to a printed circuit board using a laser beam.

2. Description of the Related Art

The technique of soldering the electronic components such as IC and LSI to the printed circuit board using the laser beam is well known (for example, see Japanese patent Application Laid-open Nos. 4-52073 and 2002-1521). In the technique, the printed circuit board is irradiated with the laser beam from a soldering head of a soldering apparatus, and the solder is melted by heat of the laser beam to perform the soldering. Advantageously the soldering can be performed in a non-contact manner.

However, as illustrated in FIG. 7, when a rod terminal 4a of an electronic component 4 is inserted in a through-hole 3 surrounded by a ring-like terminal 2 of a printed circuit board 1 in order to solder the rod terminal 4a and the ring-like terminal 2 using wire solder 5, the laser beam 6 is projected onto the electronic component 4 through a gap 3a between the ring-like terminal 2 and the rod terminal 4a before the wire solder 5 is melted by a laser beam 6 and the through-hole 3 is embedded, which results in a problem in that burning is generated in part of the electronic component 4. The wire solder 5 contains flux in a cavity portion located in the center thereof, and a flux content is as low as about 3% (ratio by weight) because of a structure of the wire solder 5. Therefore, due to wettability after melting, unfortunately it takes a long time for the melted solder to spread along the ring-like terminal 2 or the rod terminal 4a or to flow in the through-hole 3.

On the other hand, solder paste in which solder grains are formed into a paste is used instead of the wire solder 5, the solder paste is previously fed to the ring-like terminal 2 and the rod terminal 4a so as to fill the through-hole 3, and the solder paste is irradiated with the laser beam and melted to perform the soldering. In such cases, the laser beam is blocked by the solder paste not to pass through the through-hole, so that the electronic component burning problem can be avoided.

However, because the solder paste has fluidity, when an amount of solder paste necessary for the soldering between the ring-like terminal and the rod terminal is fed in a stack manner onto the ring-like terminal, the solder paste is diffused to flow to the outside of the ring-like terminal until the solder paste is irradiated with the laser beam. At this point, 10 when the solder paste is irradiated with the laser beam, the solder paste located outside the ring-like terminal is left while not melted, and the solder paste is scattered around, which easily causes a poor appearance and a conduction defect. Further, because the large amount of solder paste is fed, not only it takes a long time for the solder paste to be melted with the laser beam, but also the granular paste in the solder paste flowing previously in the through-hole is not completely melted to leave the granular paste. Therefore, a soldering defect is frequently generated.

BRIEF SUMMARY OF THE INVENTION

An object of the invention is to be able to perform the high-quality soldering by eliminating the electronic component burning problem caused by laser beam when a rod terminal of an electronic component is inserted in a through-hole surrounded by a ring-like terminal of a printed circuit board in order to solder the rod terminal and the ring-like terminal using the laser beam.

In accordance with a first aspect of the invention, a laser soldering method includes: inserting a rod terminal of an electronic component in a through-hole surrounded by a ring-like terminal of a printed circuit board; feeding solder paste to the rod terminal and the ring-like terminal so as to fill in the through-hole; irradiating the solder paste with a laser beam; feeding wire solder to the ring-like terminal and the rod terminal; and fusing the wire solder and the solder paste to solder the ring-like terminal and the rod terminal.

In the laser soldering method in accordance with the first aspect of the invention, preferably the wire solder is fed at the same time as the solder paste is irradiated with the laser beam or when melting of the solder paste is started by the irradiation with the laser beam.

In the laser soldering method in accordance with the first aspect of the invention, preferably a feed amount of solder paste is enough to completely fill in the through-hole although the feed amount of solder paste is lower than an amount necessary to solder the ring-like terminal and the rod terminal with the single solder paste, and the soldering is performed such that the wire solder is overlapped from above the solder paste.

In the laser soldering method in accordance with the first aspect of the invention, preferably a flux content of the solder paste is more than a flux content of the wire solder.

In accordance with a second aspect of the invention, a laser soldering apparatus includes a board support table that supports a printed circuit board, a rod terminal of an electronic component being inserted in a through-hole surrounded by a ring-like terminal in the printed circuit board; a solder paste feeding device that feeds solder paste to the ring-like terminal of the printed circuit board and the rod terminal such that the through-hole is filled with the solder paste; a wire solder feeding device that feeds wire solder to the ring-like terminal and the rod terminal, the solder paste being already fed to the ring-like terminal and the rod terminal; and a laser beam irradiation device that irradiates the ring-like terminal and the rod terminal with a laser beam in order to fuse the solder paste and the wire solder to solder the ring-like terminal and the rod terminal.

In the laser soldering apparatus in accordance with the second aspect of the invention, preferably the wire solder feeding device feeds the wire solder from above the solder paste at the same time as the solder paste is irradiated with the laser beam or when melting of the solder paste is started by the irradiation with the laser beam.

Preferably the laser soldering apparatus in accordance with the second aspect of the invention includes a soldering head that can be displaced relative to the board support table, wherein the solder paste feeding device, the laser beam irradiation device, and the wire solder feeding device are attached to the soldering head.

According to the invention, the solder paste is previously fed to the ring-like terminal and the rod terminal to fill in the through-hole. Therefore, in the soldering, the laser beam is blocked by the solder paste, and the laser beam cannot pass through the through-hole, which allows the burning problem to be eliminated in the electronic component. In addition to the solder paste, the wire solder is further fed to perform the soldering. Therefore, because the solder paste and the wire solder are fused to cover shortcomings of the solder paste and wire solder, high-quality soldering can be performed.

DETAILED DESCRIPTION OF THE INVENTION

Figure 1:
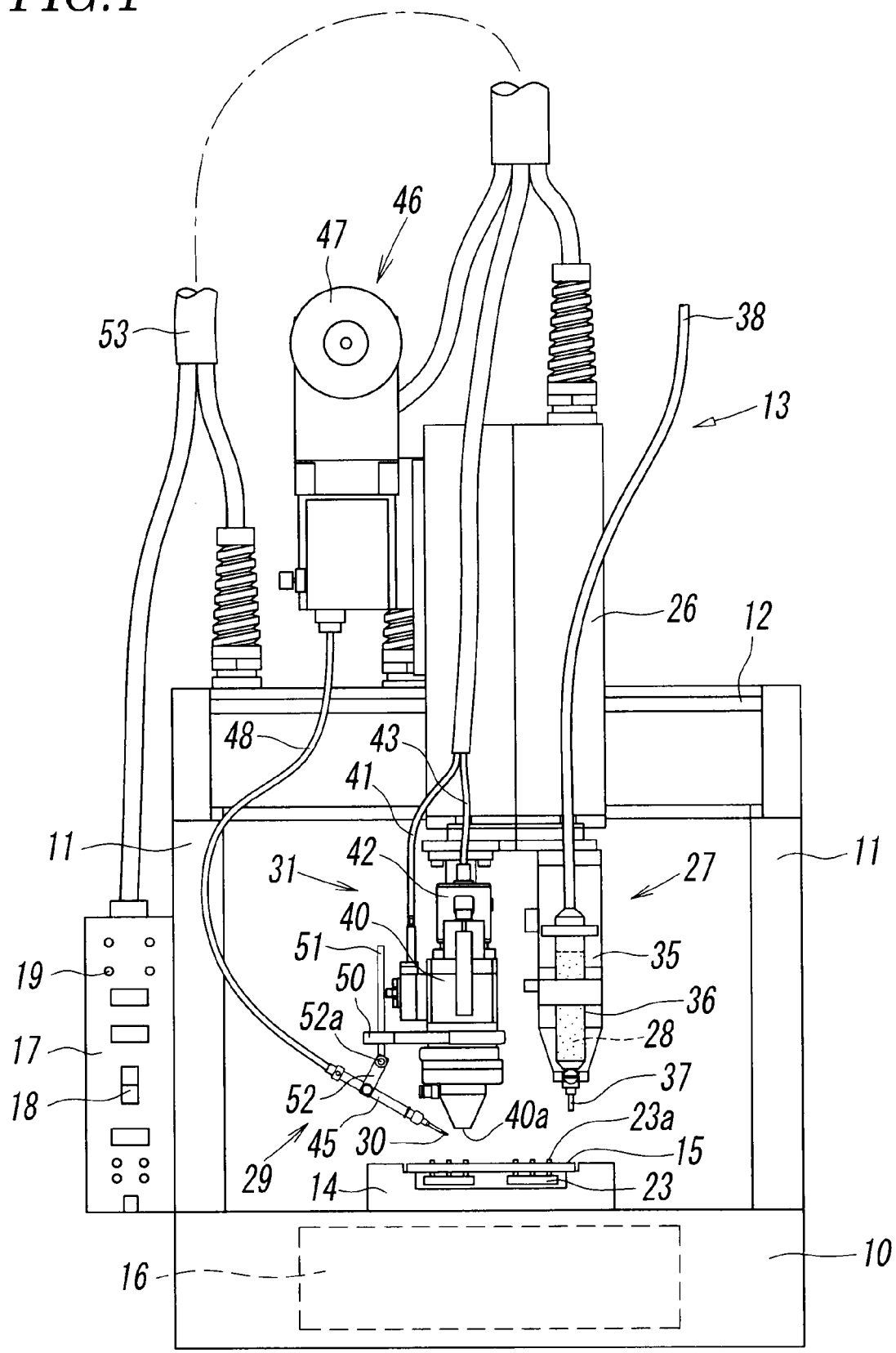
FIG. 1 is a front view illustrating a laser soldering apparatus according to an embodiment of the invention.

FIG. 1 is a front view illustrating a laser soldering apparatus according to an embodiment of the invention. The laser soldering apparatus of the embodiment automatically performs the soldering according to a setting program. The laser soldering apparatus includes a base 10 that has a rectangular shape in a planar view, a pair of support pillars 11 that is provided at right and left ends of the base 10, a guide rail 12 that is horizontally bridged between upper end portions of the support pillars 11, a soldering head 13 that is movable along the guide rail 12 in a horizontal direction (X-direction), and a board support table 14 that is disposed on the base 10 in order to place a printed circuit board 15 that is of a soldering target. The board support table 14 is movable in a back-and forth direction (Y-direction) of the base 10 by manipulation.

A control device 16 is incorporated in the base 10 in order to control an operation of the whole apparatus. A console panel 17 including a switch 18, a display lamp 19 and the like is provided in one of side faces of the right and left support pillars 11, and various settings for automatic running and display of a running state are performed by the console panel 17.

Figure 3:
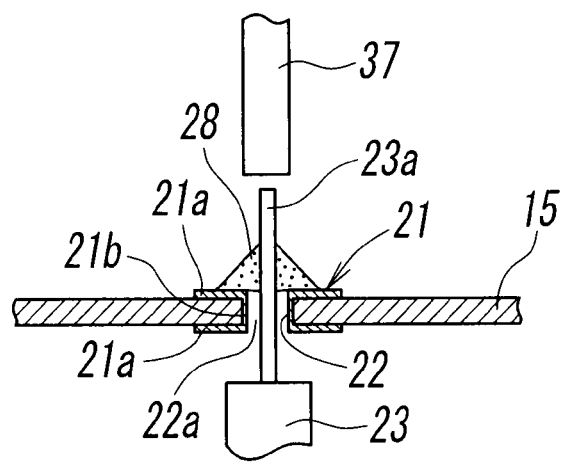
FIG. 3 is a partially sectional view illustrating a state in which solder paste is applied to one ring-like terminal and one rod terminal in a printed circuit board.

As illustrated in FIG. 3, the printed circuit board 15 has at least one through-hole 22 surrounded by a ring-like terminal 21, and the printed circuit board 15 is placed on the board support table 14 while a rod terminal 23a of an electronic component 23 is inserted in the through-hole 22.

The ring-like terminal 21 includes ring-like pad portions 21a and a cylindrical portion 21b. The pad portions 21a surround the through-hole 22 in both a surface and a backside of the board. The cylindrical portion 21b pierces through the through-hole 22 to bring the pad portions 21a into a conduction state. The pad portions 21a are connected to other terminals or electronic components by printed wiring on the board 15.

In the soldering head 13, a solder paste feeding device 27, a wire solder feeding device 29, and a laser beam irradiation device 31 are attached to a head basement 26 supported by the guide rail 12. The solder paste feeding device 27 feeds solder paste 28 (see FIG. 3) to the rod terminal 23a and the ring-like terminal 21 of the printed circuit board 15. The wire solder feeding device 29 feeds wire solder 30 (see FIG. 4) to the ring-like terminal 21 and the rod terminal 23a. The laser beam irradiation device 31 irradiates the solder paste 28 and the wire solder 30 with a laser beam 32 (see FIG. 4) to fuse together the solder paste 28 and the wire solder 30, thereby performing the soldering.

Figure 2:
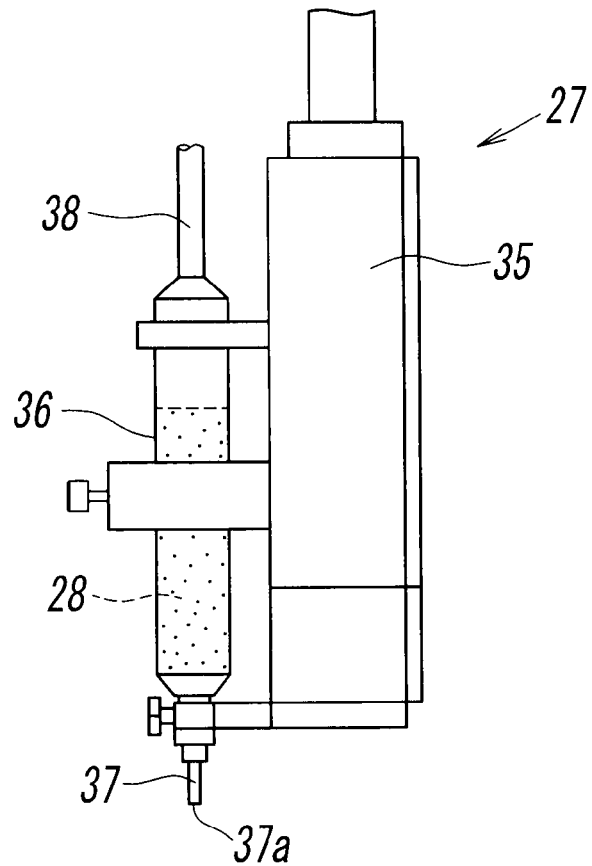
FIG. 2 is a side view illustrating a main part of a solder paste feeding device.

The solder paste feeding device 27 includes a feeding head 35. The feeding head 35 is attached to the head basement 26 while being able to be lifted and lowered, and the lifting and lowering of the feeding head 35 are controlled by the control device 16. As illustrated in FIG. 2, a cylindrical solder container 36 in which the solder paste 28 is stored is detachably attached to the feeding head 35, and a solder ejecting nozzle 37 is provided in the feeding head 35. The solder ejecting nozzle 37 feeds a constant amount of solder paste 28 delivered from the solder container 36 to the ring-like terminal 21 and the rod terminal 23a. An air tube 38 communicated with a pressurized air source is connected to the solder container 36, and the solder paste 28 in the solder container 36 is delivered to the solder ejecting nozzle 37 by a pressure of air supplied through the air tube 38.

The flux content of the solder paste 28 ranges from about 5% to about 20% (ratio by weight). The flux strengthens a surface tension of the melted solder, or prevents production of oxide to enhance wettability or diffuseness of the solder.

The solder ejecting nozzle 37 is downwardly extended from the feeding head 35, and the solder ejecting nozzle 37 includes a solder ejecting port 37a at a lower end. The control device 16 controls the lifting and lowering operations of the solder ejecting nozzle 37 and an ejecting operation of the solder paste 28. Therefore, as illustrated in FIG. 3, a predetermined amount of solder paste 28 is fed from the solder ejecting nozzle 37 to a plurality of ring-like terminals 21 on the printed circuit board 15 and a plurality of rod terminals 23a sequentially so as to fill the through-hole 22.

At this point, the amount of solder paste 28 fed from the solder ejecting nozzle 37 to each of the ring-like terminals 21 and each of the rod terminals 23a is lower than the amount of solder paste 28 necessary to solder the ring-like terminal 21 and the rod terminal 23a with the single solder paste 28. However, the amount of solder paste 28 fed from the solder ejecting nozzle 37 to each of the ring-like terminals 21 and each of the rod terminals 23a is enough to completely fill the through-hole 22.

The laser beam irradiation device 31 includes an irradiation head 40. The irradiation head 40 is attached adjacent to the feeding head 35 of the head basement 26 while freely lifted and lowered. The control device 16 controls the lifting and lowering of the irradiation head 40. A leading end portion of an optical fiber 41 is connected to a side face of an irradiation head 40 in order to introduce the laser beam 32 emitted from a laser source. Optical members, such as a one-way vision mirror for changing an orientation of the introduced laser beam 32 and an optical lens for changing a beam diameter, are incorporated in the irradiation head 40. An irradiation port 40a is provided at a leading end of the irradiation head 40 in order to irradiate the soldering target with the laser beam 32 outgoing from the optical member. However, the optical member is not illustrated. The laser beam 32 outgoing from the irradiation head 40 has a circular shape.

A CCD camera 42 is attached to an upper end portion of the irradiation head 40, and an image of the soldering target can be taken through the irradiation port 40a with the CCD camera 42. The image of the soldering target, taken with the CCD camera 42, is displayed on a monitor (not illustrated), and positioning or teaching for irradiating the soldering target with the laser beam can be performed while the displayed image is viewed. A lead 43 is used to transmit an image signal from the CCD camera 42 to the control device 16.

The wire solder feeding device 29 includes a thin rod-shape wire solder nozzle 45 that feeds the wire solder 30 to the ring-like terminal 21 and the rod terminal 23a and a wire solder feeding unit 46 that delivers the necessary amount of wire solder 30 from a reel 47 to the wire solder nozzle 45. The wire solder feeding unit 46 and the wire solder nozzle 45 are coupled to each other by a solder delivery tube 48.

The wire solder nozzle 45 is supported by the irradiation head 40 of the laser beam irradiation device 31, and the wire solder nozzle 45 can be lifted and lowered along with the irradiation head 40. A support rod 51 is attached to a support member 50 provided in the irradiation head 40 such that the position of the support rod 51 can be adjusted in a vertical direction. A swing member 52 is attached to a lower end of the support rod 51 so as to be able to be turned about a shaft 52a, and the wire solder nozzle 45 is supported by the swing member 52 such that the position of the wire solder nozzle 45 can be adjusted in a shaft-line direction of the wire solder nozzle 45. Accordingly, in the wire solder nozzle 45, a distance with the ring-like terminal 21 and the rod terminal 23a can be adjusted in the vertical direction and the horizontal direction, and an inclination angle can also be adjusted.

The wire solder feeding unit 46 includes the reel 47 and a driving mechanism (not illustrated) that drives the reel 47. The reel 47 is attached to the side face of the head basement 26, and the wire solder 30 is wound about the reel 47. The flux content of the wire solder 30 is lower than the flux content of the solder paste 28, and the flux content of the wire solder 30 ranges from about 0 to about 4% (ratio by weight). However, obviously the wire solder having the flux content that is more than 4% may be used.

A cable 53 electrically connects the head basement 26, the console panel 17, a head basement driving device provided in the guide rail 12, and the control device 16 in the base 10 to one another.

In the laser soldering apparatus having the above-described configuration, when the rod terminals 23a and the ring-like terminals 21 of the printed circuit board 15 placed on the board support table 14 are soldered, the solder paste feeding device 27 feeds and applies the solder paste 28 to each ring-like terminal 21 and each rod terminal 23a. As typically illustrated in the ring-like terminal 21 and the rod terminal 23a of FIG. 3, the setting amount of solder paste 28 is fed onto the pad portion 21a of the ring-like terminal 21 from the solder ejecting nozzle 37 of the solder paste feeding device 27 moved onto the printed circuit board 15 such that a gap 22a around the rod terminal 23a in the through-hole 22 is filled while the solder paste 28 does not smudge around the pad portion 21a.

At this point, although the feed amount of solder paste 28 is lower than the amount of solder paste 28 necessary to solder the ring-like terminal 21 and the rod terminal 23a with the single solder paste 28, the feed amount of solder paste 28 is enough to completely fill the gap 22a. Accordingly, because the solder paste 28 is small in application amount, the solder paste 28 does not flow to the outside of the ring-like terminal 21 until the solder paste 28 is irradiated with the laser beam 32. It is not necessary that the through-hole 22 is completely filled with the solder paste 28.

The flux content of the solder paste 28 is adjusted within a range of 5 to 20% (ratio by weight).

Figure 4:
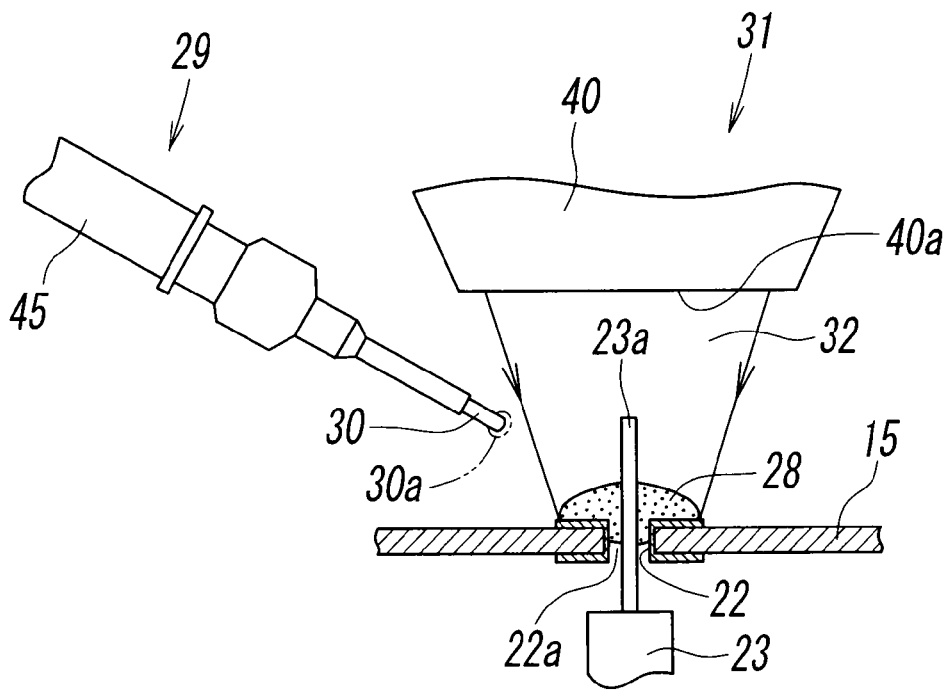
FIG. 4 is a partially sectional view illustrating a state in which the solder paste of FIG. 3 is irradiated with a laser beam.

When the application of the solder paste 28 is completed to all the ring-like terminals 21 and all the rod terminals 23a, the laser beam irradiation device 31 is moved onto the printed circuit board 15, and the ring-like terminal 21 and rod terminal 23a to which the solder paste 28 is applied are irradiated with the laser beam 32 from the irradiation head 40 as illustrated in FIG. 4. At this point, the wire solder feeding device 29 does not feed the wire solder 30 yet.

Figure 5:
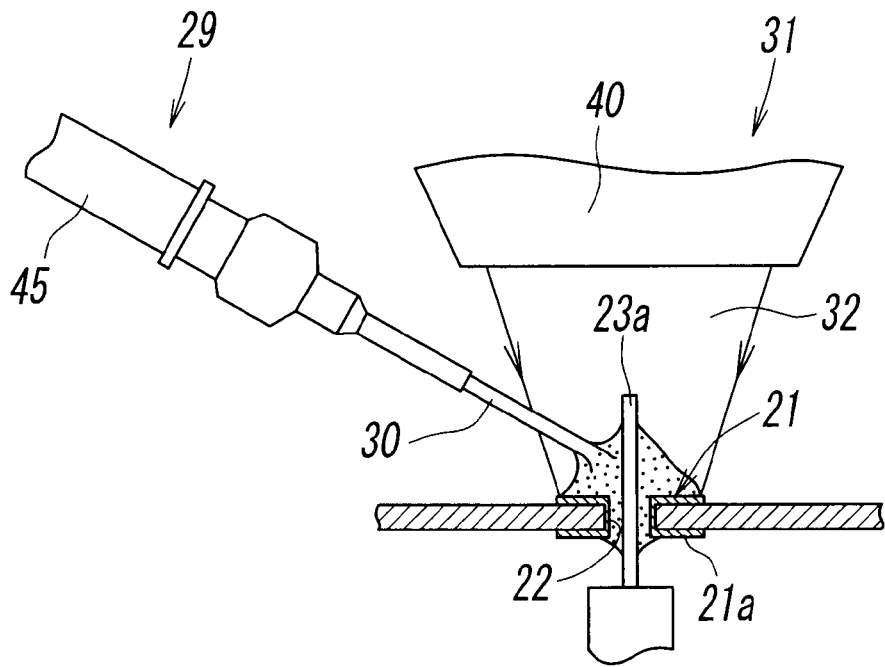
FIG. 5 is a partially sectional view illustrating a state in which wire solder is fed to the solder paste of FIG. 4.

When the solder paste 28 is irradiated with the laser beam 32, the solder paste 28 is heated and melted in a moment. In response to the start of the melting of the solder paste 28 after the irradiation with the laser beam 32, specifically at the substantially same time as the melting of the solder paste 28 is started, or immediately before or immediately after the melting of the solder paste 28 is started, as illustrated in FIG. 5, the wire solder 30 having a setting length (amount) is delivered from the wire solder nozzle 45 of the wire solder feeding device 29, and the wire solder 30 is fed from above the solder paste 28 to the ring-like terminal 21 and the rod terminal 23a.

A time lag from the irradiation with the laser beam 32 to the start of the melting of the solder paste 28 depends on the application amount of the solder paste 28 and a heat capacity of the laser beam 32. Usually the time lag ranges from about 0.1 to about 0.5 second. Accordingly, a time lag from the start of the irradiation with the laser beam 32 to the feed of the wire solder 30 is actually negligible.

The wire solder 30 having the flux content that is lower than that of the solder paste 28 is used, and the flux content of the wire solder 30 is adjusted within a range of 0 to 4% (ratio by weight).

The fed wire solder 30 is melted by the heat of the laser beam 32 and the heat from the solder paste 28, and the wire solder 30 penetrates in the through-hole 22 along with the solder paste 28 while fused with the solder paste 28 whose melting is previously started. Then, the wire solder 30 reaches the backside of the printed circuit board 15, and the wire solder 30 is diffused along the pad portion 21a in the backside of the ring-like terminal 21. As described above, the solder paste 28 whose flux content is more than that of the wire solder 30 is previously applied, and the wire solder 30 is fed when the melting and diffusion of the solder paste 28 are started by the irradiation with the laser beam 32. Therefore, even if the flux content per unit volume of the wire solder 30 is lower than that of the solder paste 28, the wettability and diffuseness of the whole solder to the ring-like terminal 21 and rod terminal 23a and a penetrative property of the whole solder in the through-hole 22 are largely improved by action of the flux much contained in the solder paste 28.

Figure 6:
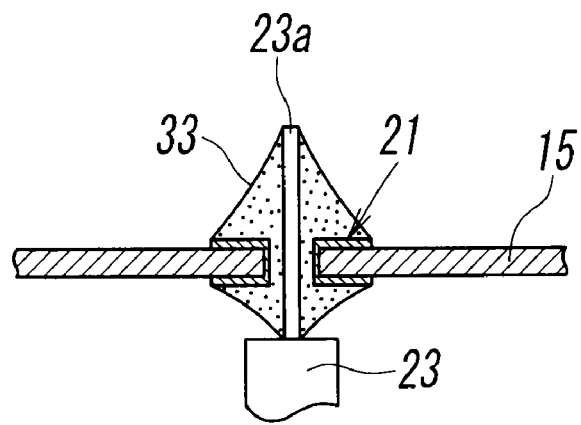
FIG. 6 is a partially sectional view illustrating a state in which soldering is completed.
Figure 7:
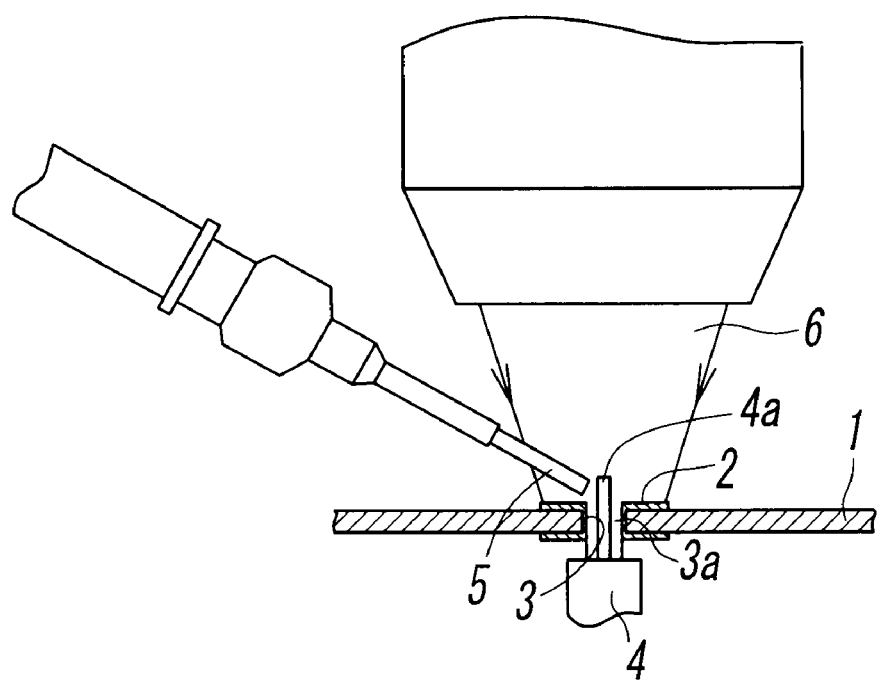
FIG. 7 is a partially sectional view illustrating a conventional soldering method.

As a result, as illustrated in FIG. 6, the ring-like terminal 21 and the rod terminal 23a are accurately soldered while widely and thickly involved by a solder fusion material 33 in which the solder paste 28 and the wire solder 30 are fused.

A final building-up amount of solder, that is, the building-up amount of solder as the solder fusion material 33 can obviously be adjusted to an optimum amount by adjusting the length (amount) of the fed wire solder 30 according to the soldering target. Further, the building-up amount of solder can freely be adjusted to a generous amount or a smaller amount of solder if needed.

During the irradiation with the laser beam 32, as illustrated in FIG. 4, because the gap 22a around the rod terminal 23a in the through-hole 22 is completely filled with the solder paste 28, the laser beam 32 is blocked by the solder paste 28, and the laser beam 32 cannot pass through the through-hole 22. Therefore, the problem with the burning of the electronic component 23, caused by irradiation with the laser beam 32, is completely eliminated.

When the wire solder 30 is fed from above the solder paste 28 that is heated or starts to be melted by the laser beam 32, because the wire solder 30 is heated by both the laser beam 32 and the solder paste 28, a melting speed of the wire solder 30 that is hardly melted in single use is largely enhanced, and a time necessary for the soldering is shortened compared with the single use of the wire solder 30.

Additionally, in feeding the wire solder 30, the flux contained in the solder paste 28 is vaporized as the solder paste 28 is heated and melted, and the flux adheres to the outer surface of the wire solder 30. Therefore, when the soldering is finished at one point, that is, at one set of the ring-like terminal 21 and the rod terminal 23*a*, the leading end portion of the wire solder 30 that is melted down by the laser beam 32 is cut while a wire diameter is substantially maintained by the action of the adhering flux as illustrated by a solid line of FIG. 4, and an error is not generated in the feed amount of wire solder 30 when the next point is soldered.

In cases where the wire solder 30 whose flux content is zero or lower than usual is solely used, it is known that the leading end portion of the wire solder 30 that is melted down by the laser beam goes into a state in which a bold ball 30*a* adheres to the leading end portion. In such cases, unfortunately not only the error is easy to generate in the feed amount of wire solder 30 when the next point is soldered, but also the wire solder is hardly melted.

In the embodiment, the wire solder 30 is fed to the ring-like terminal 21 and the rod terminal 23*a* in response to the start of the melting of the solder paste 28 after the irradiation with the laser beam 32. However, the time lag from start of the irradiation with the laser beam 32 to the start of the melting of the solder paste 28 is extremely short, and the time lag is further shortened particularly in the case of the small application amount of solder paste 28 or in the case of the large heat capacity of the laser beam 32. Therefore, the wire solder 30 may be fed at the substantially same time as the solder paste 28 is irradiated with the laser beam 32.

In the embodiment, the solder paste feeding device 27, the wire solder feeding device 29, and the laser beam irradiation device 31 are collectively provided in the soldering head 13 of the laser soldering apparatus. Alternatively, the solder paste feeding device 27 may be separated from the soldering head 13 and formed as an independent device. In such a case, the laser soldering apparatus of the invention includes the solder paste feeding device 27, the laser beam irradiation device 31, the wire solder feeding device 29, and a board conveying line (not illustrated) that connects these devices.

The printed circuit board 15 to which the solder paste feeding device 27 applies the solder paste 28 is conveyed to the positions of the laser beam irradiation device 31 and wire solder feeding device 29 by the board conveying line, and the soldering is performed by the irradiation with the laser beam 32 and the feed of the wire solder 30.

In the ring-like terminal 21, a pad portion 21*a* may be provided in one of the surfaces of the printed circuit board 15.

What is claimed is:

1. A laser soldering method comprising:
   inserting a rod terminal of an electronic component in a through-hole surrounded by a ring shaped terminal of a printed circuit board;
   feeding solder paste to the rod terminal and the ring shaped terminal so as to fill in the through-hole;
   irradiating the solder paste with a laser beam;
   feeding wire solder to the ring shaped terminal and the rod terminal; and
   fusing the wire solder and the solder paste to solder the ring shaped terminal and the rod terminal.

2. The laser soldering method as in claim 1, wherein a flux content of flux in the solder paste is from 5% to 20% (by weight).

3. The laser soldering method according to claim 1, wherein the wire solder is fed at the same time as the solder paste is irradiated with the laser beam or when melting of the solder paste is started by the irradiation with the laser beam.

4. The laser soldering method according to claim 1 or 3, wherein
   a feed amount of solder paste is enough to completely fill in the through-hole although the feed amount of solder paste is lower than an amount necessary to solder the ring shaped terminal and the rod terminal with the single solder paste, and
   the soldering is performed such that the wire solder is overlapped from above the solder paste.

5. The laser soldering method as in claim 4, wherein a flux content of the solder paste is more than a flux content of the wire solder.

6. The laser soldering method as in any one of claims 1 or 3, wherein a flux content of the solder paste is more than a flux content of the wire solder.

7. A laser soldering apparatus comprising:
   a board support table that supports a printed circuit board, a rod terminal of an electronic component being inserted in a through-hole surrounded by a ring shaped terminal in the printed circuit board;
   a solder paste feeding device adapted to feed solder paste to the ring shaped terminal of the printed circuit board and the rod terminal such that the through-hole is filled with the solder paste;
   a wire solder feeding device adapted to feed wire solder to the ring shaped terminal and the rod terminal;
   a laser beam irradiation device adapted to irradiate the ring shaped terminal and the rod terminal with a laser beam; and
   a controller adapted to control the solder paste feeding device and the laser beam irradiation device such that the solder paste feeding device feeds solder paste to the ring shaped terminal of the printed circuit board and the rod terminal, to fill the through-hole with the solder paste, before the laser beam irradiation device irradiates the ring shaped terminal and the rod terminal with a laser beam to fuse the solder paste and the wire solder to solder the ring shaped terminal and the rod terminal.

8. The laser soldering apparatus according to claim 7, comprising a soldering head that can be displaced relative to the board support table,
   wherein the solder paste feeding device, the laser beam irradiation device, and the wire solder feeding device are attached to the soldering head.

* * * * *